(12) United States Patent
Rachmady et al.

(10) Patent No.: US 7,833,887 B2
(45) Date of Patent: Nov. 16, 2010

(54) NOTCHED-BASE SPACER PROFILE FOR NON-PLANAR TRANSISTORS

(75) Inventors: Willy Rachmady, Beaverton, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/145,020

(22) Filed: Jun. 24, 2008

(65) Prior Publication Data

US 2009/0315101 A1  Dec. 24, 2009

(51) Int. Cl.
*H01L 21/26* (2006.01)
*H01L 21/42* (2006.01)

(52) U.S. Cl. ............... 438/513; 438/311; 438/680; 438/733; 438/9; 257/E21.17; 257/E21.4; 257/E21.32; 257/E21.051; 257/E21.411; 257/E21.182; 257/E21.218; 257/E21.229; 257/E21.227

(58) Field of Classification Search ............. 438/9, 438/197, 311, 513, 706, 733, 745, 752, 753, 438/933; 257/288, 347, 350, 352, E21.17, 257/4, 32, 51, 182, 218, 227, 229, 411
See application file for complete search history.

(56) References Cited

U.S. PATENT DOCUMENTS

| | | | | |
|---|---|---|---|---|
| 6,413,802 B1 * | 7/2002 | Hu et al. | .................... | 438/151 |
| 6,657,252 B2 * | 12/2003 | Fried et al. | .................. | 257/316 |
| 6,768,158 B2 * | 7/2004 | Lee et al. | ..................... | 257/315 |
| 7,491,630 B2 * | 2/2009 | Shroff et al. | ................ | 438/510 |
| 7,601,592 B2 * | 10/2009 | Oh et al. | ..................... | 438/259 |
| 2008/0073723 A1 * | 3/2008 | Rachmady et al. | .......... | 257/369 |

* cited by examiner

*Primary Examiner*—David Nhu
(74) *Attorney, Agent, or Firm*—Robert G. Winkle; Winkle, PLLC

(57) ABSTRACT

A method of forming a notched-base spacer profile for non-planar transistors includes providing a semiconductor fin having a channel region on a substrate and forming a gate electrode adjacent to sidewalls of the channel region and on a top surface of the channel region, the gate electrode having on a top surface a hard mask. a spacer layer is deposited over the gate and the fin using a enhanced chemical vapor deposition (PE-CVD) process. A multi-etch process is applied to the spacer layer to form a pair of notches on laterally opposite sides of the gate electrode, wherein each notch is located adjacent to sidewalls of the fin and on the top surface of the fin.

17 Claims, 5 Drawing Sheets

Vertical cross-section through gate and fin

Horizontal cross-section through gate and sidewalls of fin

200

NOTCHED-BASE SPACER PROFILE FOR NON-PLANAR TRANSISTORS

BACKGROUND

The present invention relates generally to semiconductor devices, and more particularly to reducing parasitic resistance in source and drain contacts in non-planar integrated circuit transistors.

Trigate and finFET devices employ a channel connecting source and drain contact regions structured as a three-dimensional fin. The gate electrode controlling the channel current is applied to three exposed surfaces, i.e., two sides and a top. An insulating spacer layer may be applied to protect the gate electrode wrapped around and over the channel portion of the fin. The exposed source and drain regions of the fin may be metalized for electrical contact with a salicidation process. The thickness of the spacer generally limits the contact surface area available to the source drain region, a condition that becomes increasingly burdensome as device technology scales to smaller dimensions. The spacer conventionally flares at the base of the gate, limiting source/drain contact area and the uniformity of the gate on the fin's sidewalls and top.

BRIEF DESCRIPTION OF THE DRAWINGS

Embodiments of the present invention are understood by referring to the figures in the attached drawings, as provided below.

Features, elements, and aspects of the invention that are referenced by the same numerals in different figures represent the same, equivalent, or similar features, elements, or aspects, in accordance with one or more embodiments. Furthermore, it should be understood that the various embodiments shown in the figures are illustrative representations and are not necessarily drawn to scale.

DETAILED DESCRIPTION OF EXEMPLARY EMBODIMENTS

In the following, numerous specific details may be set forth, such as specific dimensions and chemical regimes, in order to provide a thorough understanding of the disclosed embodiments. In other instances, some details, such as patterning steps or wet chemical cleans, are not described in detail to avoid unnecessarily obscuring the claimed embodiments. It should be understood that the processes, methods, and the order in which the respective elements of each method are performed are purely exemplary. Depending on the implementation, they may be performed in a different order or in parallel, unless indicated otherwise.

In one embodiment, a method of fabricating a notched-base spacer profile for non planar transistors is provided. A semiconductor fin having a channel region is formed on a substrate. A gate electrode is formed adjacent to sidewalls of the channel region and on a top surface of the channel region. A hard mask may be formed on the top surface of the gate electrode. A spacer layer is deposited over the gate and the fin using a plasma enhanced chemical vapor deposition (PE-CVD) process. A multi-etch process is applied to the spacer layer to form a pair of notches on laterally opposite sides of the gate electrode, wherein each notch is located substantially adjacent to sidewalls of the fin and on the top surface of the fin.

Figure 1:
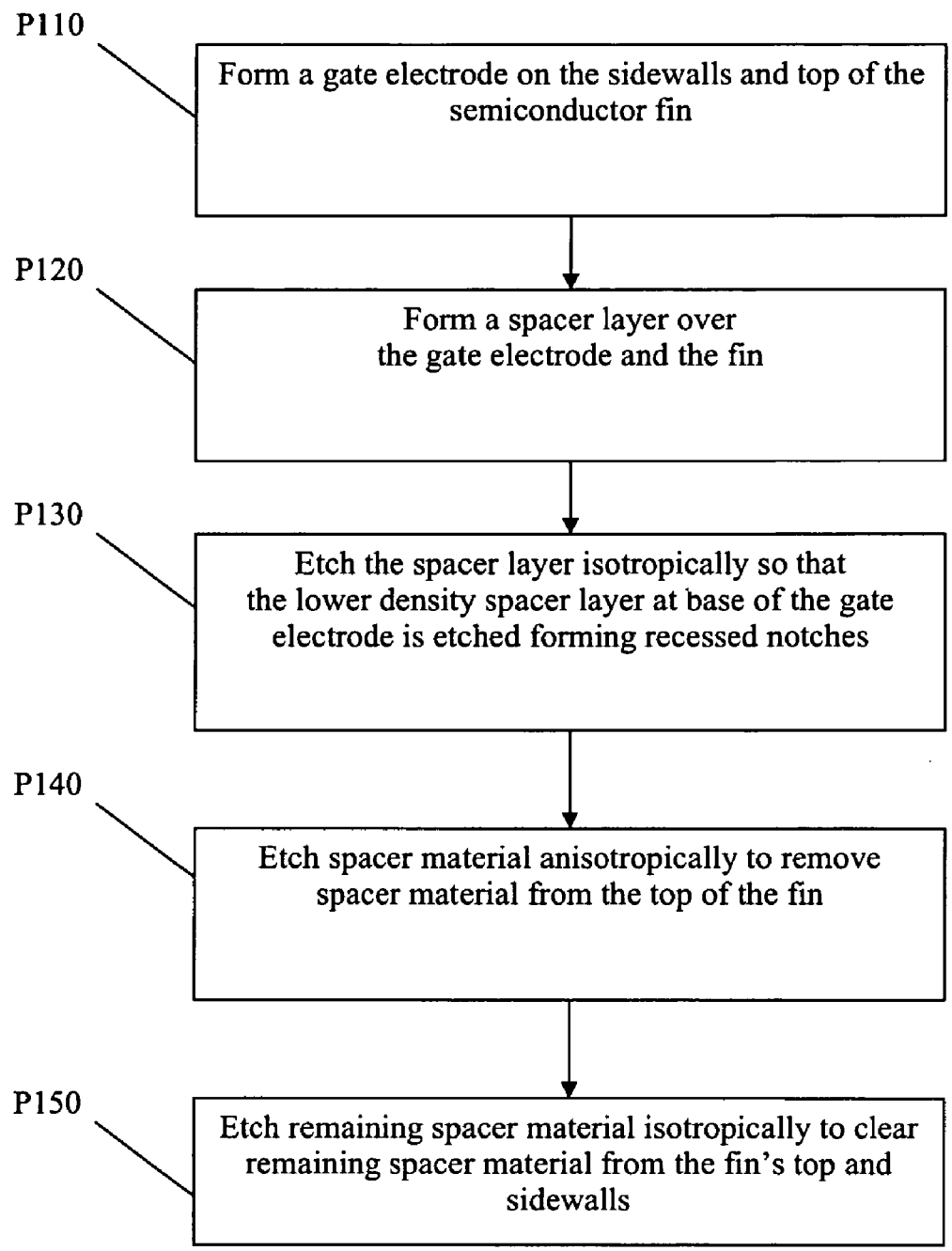
FIG. 1 is a process flow diagram for forming a notched-base spacer profile according to one embodiment.

FIG. 1 illustrates an exemplary method 100 for forming a notched-base spacer profile according to one embodiment. FIGS. 2A-2E show various layer formations in the process of fabricating a semiconductor device 200, such as the one illustrated in FIG. 3.

Figure 2A:
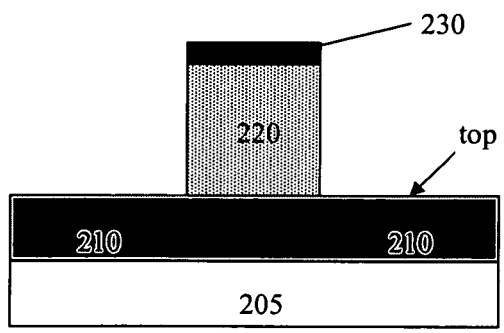
FIGS. 2A-2E illustrate side and top cross-sectional views of various steps of forming a device having a notch-base spacer profile according to one embodiment, as shown in FIG. 3 along example cross sections A-A' and B-B'.
Figure 2A:
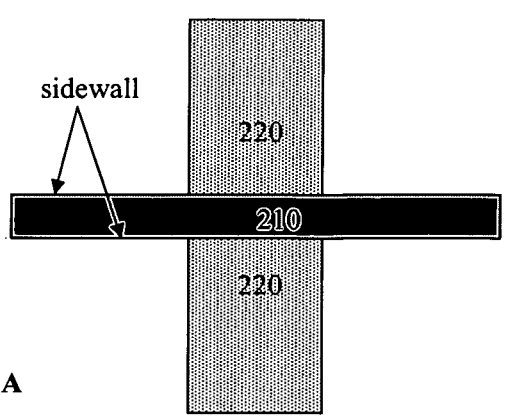

Referring to FIGS. 1 and 2A, a semiconductor fin 210 is formed on a semiconductor substrate 205. The fin 210 has a source, drain and channel regions. The fin 210 may comprise a semiconductor such as, for example, silicon, and germanium. The semiconductor may be single or polycrystalline. The fin 210 may preferably be a single crystal. A gate electrode 220 may be formed over the channel region of fin 210 contacting the substantially vertical sidewalls and top surface of the fin 210 (P110 of FIG. 1). Gate electrode 220 may comprise conductive material such as polysilicon, or a metal formed by way of a replacement metal gate (RMG) process. A hard mask 230 may be formed over the top surface of the gate electrode 220.

Figure 2B:
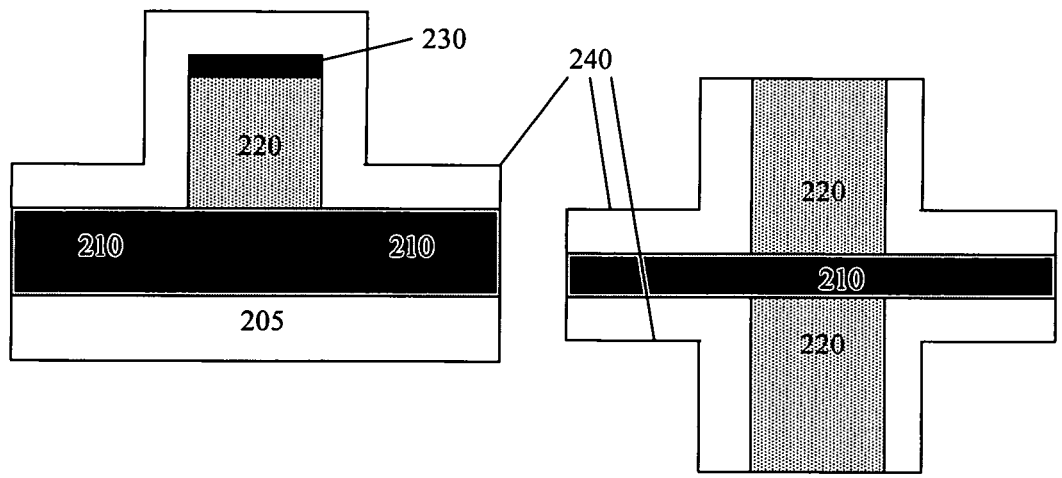

Referring to FIGS. 1 and 2B, a spacer layer 240 may be deposited over the gate electrode 220, the hard mask layer 230, and the fin 210 (P120). In one embodiment, the spacer layer 240 comprises insulating material, such as, for example $Si_3N_4$. Depending on implementation, spacer layer 240 may be deposited by way of plasma-enhanced chemical vapor deposition (PE-CVD). The bulk of the spacer layer 240 may be significantly consumed during subsequent multiple etch processes as provided in further detail below. Therefore, a greater thickness of the spacer layer 240 may be initially deposited. For an example, the spacer layer may be deposited with a thickness of 240a 350 Å to 400 Å to achieve a post-etch thickness of 100 Å to 150 Å. In one embodiment, the spacer layer 240 may be deposited with a lower density at the base of the gate electrode 220 adjacent to the top surface and sidewalls of fin 210 in comparison with the laterally opposite surfaces away from the base of the gate electrode 220.

Figure 2C:
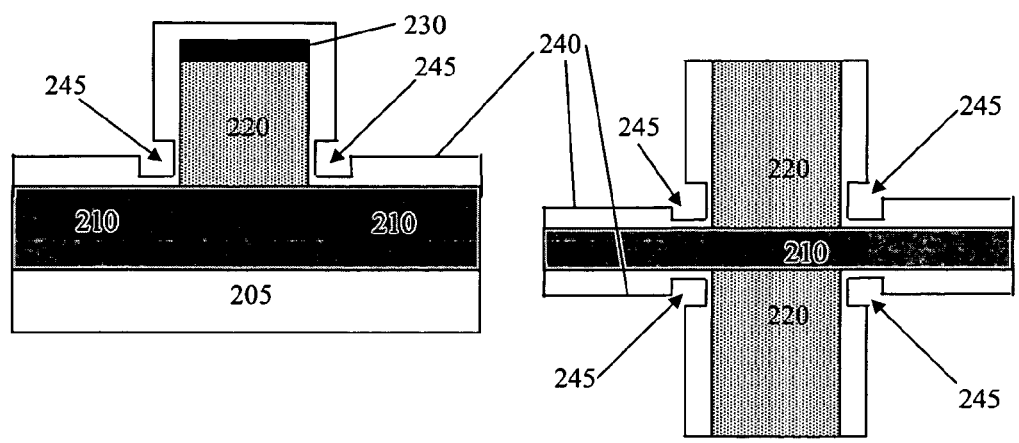

Referring to FIGS. 1 and 2C, the spacer layer 240 may be isotropically etched, by way of an aqueous HF (wet HF) etch for example, to reduce the thickness of the spacer layer 240 at the based of the gate electrode 220 to form recessed notches 245 (P130). The isotropic etch may reduce the thickness of the spacer layer 240 on the top and sidewalls of the fin 210. It is noteworthy that in certain embodiments, the PE-CVD deposition and the topography of the gate/fin structure have the property that the spacer layer 240 at the base of the gate electrode 220 adjacent to the top surface and sidewalls of fin 210 has a lower density than at the laterally opposite surfaces away from the base of the gate electrode 220. Therefore, the spacer layer 240 at the base of the gate electrode 220 may etch faster, leaving a thinner amount of spacer layer 240 and thus forming notches 245.

Figure 2D:
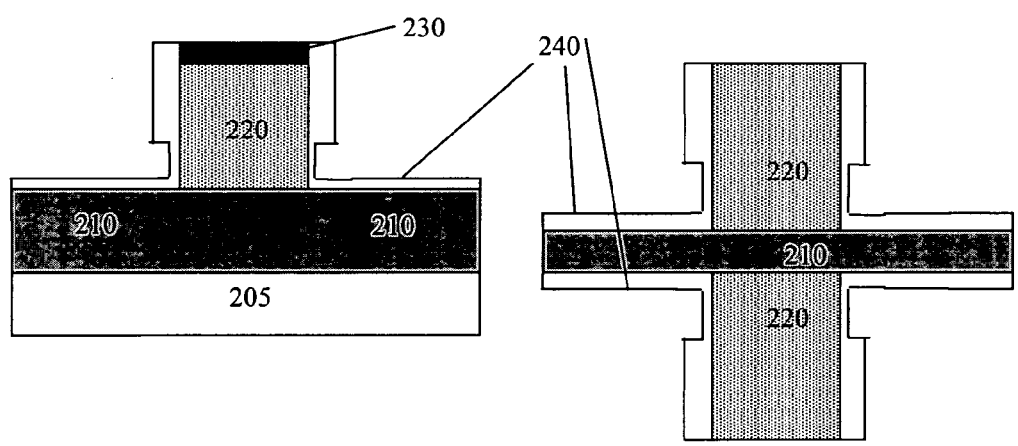

Referring now to FIGS. 1 and 2D, the remaining spacer layer 240 may be anisotropically etched to remove spacer material from the top of the fin 210 (P140). In one embodiment, spacer layer 240 is substantially etched in the vertical direction so that the spacer layer 240 is removed from the top of the contact electrode 220, exposing the hard mask 230. The etching process may further reduce the thickness of spacer layer 240 on the top surface of the fin 210. The anisotropic etch may be, for example, a plasma dry etch based on one or more of $CF_3$, $CF_4$ or $CHF_3$.

Figure 2E:
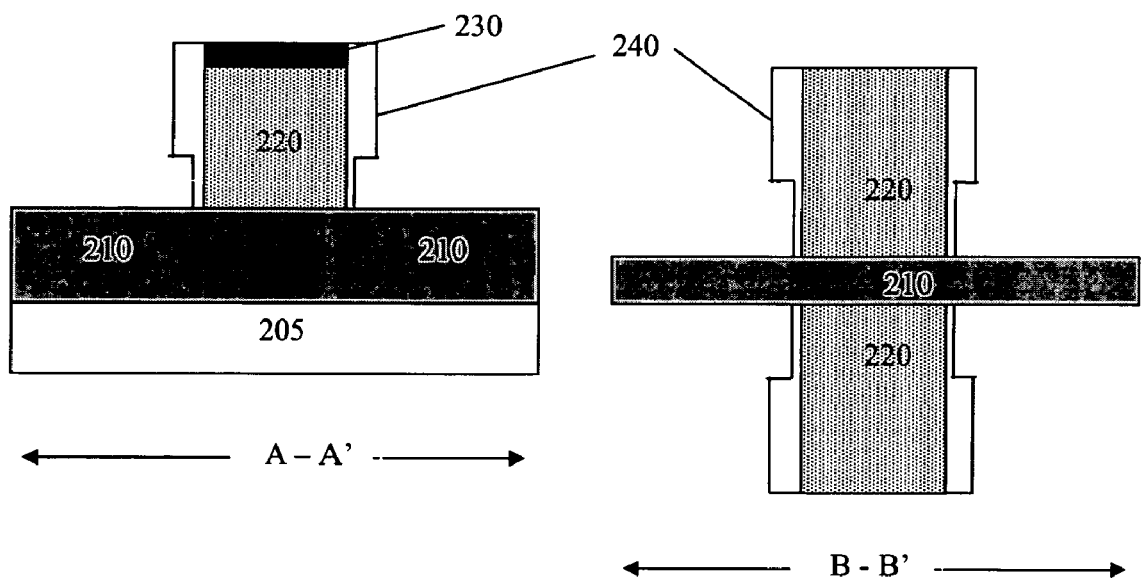
Figure 3:
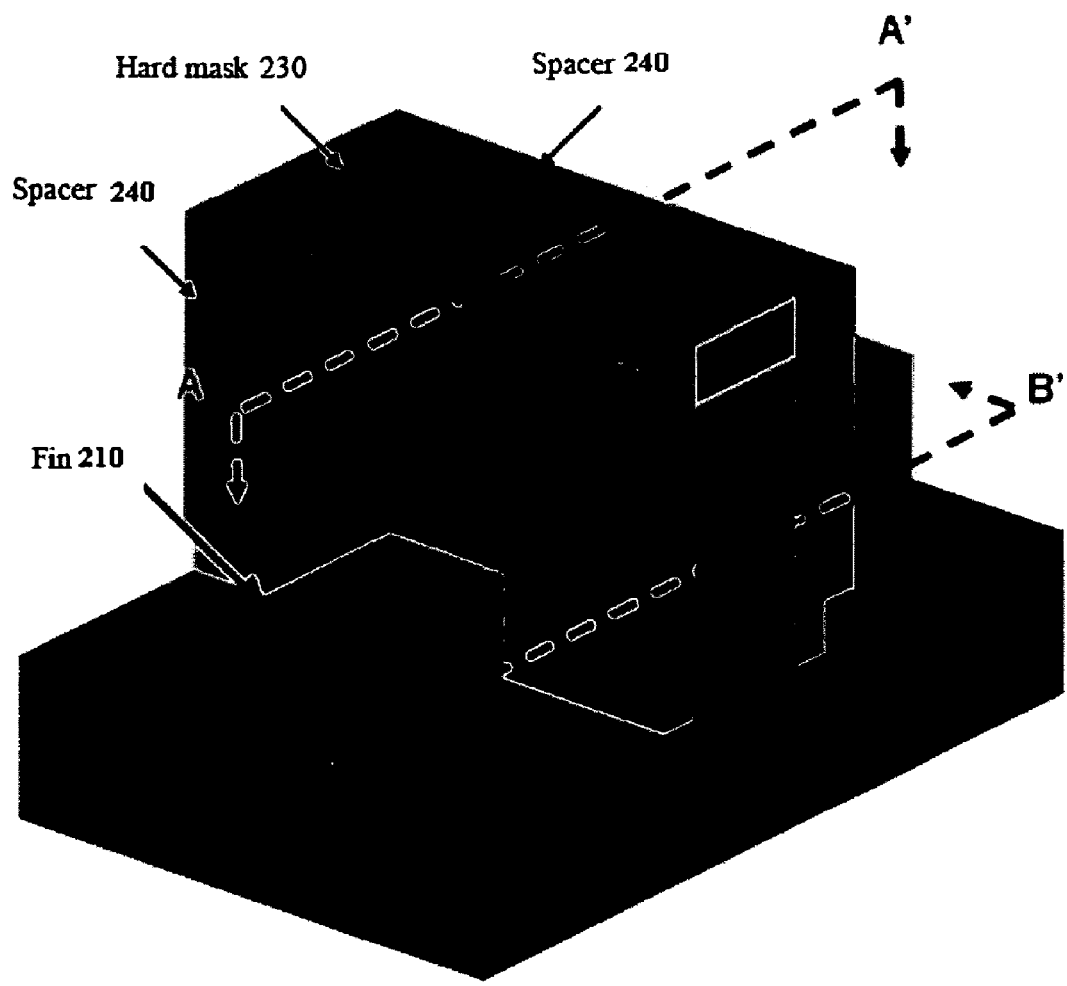
FIG. 3 is a perspective view of the completed device of FIGS. 2A-2E.

Referring to FIGS. 1, 2E and 3, the remaining spacer 240 layer may be further etched with an isotropic etchant to remove remaining spacer layer 240 material from the top and sidewalls of the fin 210 (P150). An exemplary isotropic etch may include, for example, an aqueous HF (wet HF) etch, without limitation. A small amount of thinning of spacer layer 240 may also occur on the lateral opposite sides of gate electrode 220. Depending on implementation, the details of the multiple etch processes and the initial thickness with which the spacer layer 240 is deposited may be selected to reach the desired thicknesses of the recessed notches 245 at the base of the gate electrode 220, adjacent to the fin 210.

It may be appreciated that the recessed spacer layer 240 at the base of the gate electrode 240 surrounding the fin 220 may provide improved control of the spacer layer thickness as device dimension are scaled to higher density. Furthermore, the method may improve the uniformity of gate control on the sidewalls and top of the fin 210. Even further, the method may provide improved removal of spacer layer 240 from the source/drain regions of the fin 210, such that source/drain salicidation and metal contact are improved.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form, or trigate fabricated on bulk Si wafer. In one implementation, the chip may be mounted in a single chip package (such as a plastic carrier, with leads that are affixed to a motherboard or other higher level carrier) or in a multi-chip package (such as a ceramic carrier that has either or both surface interconnections of buried interconnections).

In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating a semiconductor device, the method comprising:
   forming a semiconductor fin on a substrate, the semiconductor fin having a channel region;
   forming a gate electrode adjacent to sidewalls of the channel region and on a top surface of the channel region;
   depositing a spacer layer over the gate electrode and the semiconductor fin using a plasma enhanced chemical vapor deposition (PE-CVD) process; and
   applying a multi-etch process to the spacer layer to form one or more notches on laterally opposite sides of the gate electrode, wherein each notch is located adjacent to sidewalls of the semiconductor fin and on the top surface of the semiconductor fin.

2. The method of claim 1, wherein a hard mask is formed over the gate electrode.

3. The method of claim 2, wherein the spacer layer is deposited to a thickness of approximately 350 Å to 400 Å.

4. The method of claim 1, wherein the spacer layer comprises $Si_3N_4$.

5. The method of claim 3, wherein the spacer layer deposited by the PE-CVD process has a lower density at the base of the gate electrode and the semiconductor fin's sidewalls and top surface in comparison with the spacer layer deposited at the laterally opposite surfaces of the gate electrode away from the base of the gate electrode.

6. The method of claim 5, wherein applying a multi-etch process to form the one or more notches comprises:
   etching the spacer layer isotropically, wherein the lower density spacer layer is etched more than the spacer layer away from the base of the gate electrode and the semiconductor fin's sidewalls and top surface;
   etching the spacer layer anisotropically to reduce thickness of the spacer layer to expose the semiconductor fin's top surface and the hard mask on the top surface of the gate electrode; and
   etching the spacer layer isotropically to remove the remaining spacer layer from the semiconductor fin's sidewalls.

7. The method of claim 5, wherein the anisotropic etch is a plasma dry etch based on one or more of $CF_3$, $CF_4$ or $CHF_3$.

8. The method of claim 5, wherein the spacer layer at the laterally opposite surfaces away from the base of the gate electrode has a final thickness of approximately 100 Å to 150 Å.

9. The method of claim 5, wherein the isotropic etch is a wet etch comprising HF.

10. A semiconductor device comprising:
    a semiconductor fin having a channel region, the semiconductor fin formed on a substrate;
    a gate electrode formed adjacent to sidewalls of the channel region and on a top surface of the channel region;
    a spacer layer formed over the gate electrode and the semiconductor fin using a plasma enhanced chemical vapor deposition (PE-CVD) process; and
    a pair of notches formed on laterally opposite sides of the gate electrode, wherein each notch is located approximately adjacent to the semiconductor fin's sidewalls and top surface, wherein the spacer layer is formed by a multi-etch process.

11. The device of claim 10, wherein the spacer layer is deposited to a thickness of approximately 350 Å to 400 Å.

12. The device of claim 10, wherein the spacer layer comprises $Si_3N_4$.

13. The device of claim 10, wherein the spacer layer deposited by the PE-CVD process has a lower density at the base of the gate electrode and the semiconductor fin's sidewalls and top surface than at surfaces away from the base of the gate electrode.

14. The device of claim 11, wherein a hard mask is formed over the top surface of the gate electrode and wherein the pair of notches are formed by at least one of:
    an isotropic etch, wherein the lower density spacer layer is etched more than the spacer layer away from the base of the gate electrode and the semiconductor fin's sidewalls and top surface;
    an anisotropic etch to approximately vertically recess the spacer layer, exposing the top surface of the semiconductor fin and the hard mask on the top surface of the gate electrode; and an isotropic etch to remove remaining spacer layer from the semiconductor fin's sidewalls.

15. The device of claim 14, wherein the isotropic etch is a wet etch comprising HF.

16. The device of claim 14, wherein the anisotropic etch is a plasma dry etch based on one or more of $CF_3$, $CF_4$ or $CHF_3$.

17. The device of claim 14, wherein the spacer layer at the laterally opposite surfaces away from the base of the gate electrode has a final thickness of approximately 100 Å to 150 Å.

* * * * *